United States Patent [19]

Chen

[11] Patent Number: 5,671,111

[45] Date of Patent: Sep. 23, 1997

[54] APPARATUS FOR ELECTRO-STATIC DISCHARGE PROTECTION IN A SEMICONDUCTOR DEVICE

[75] Inventor: Jerry Chen, Taipei, Taiwan

[73] Assignee: Motorola, Inc., Schaumburg, Ill.

[21] Appl. No.: 550,056

[22] Filed: Oct. 30, 1995

[51] Int. Cl.$^6$ ................................................ H02H 9/00
[52] U.S. Cl. ................................................ 361/56; 361/111
[58] Field of Search ................................ 361/56, 111, 91

[56] References Cited

U.S. PATENT DOCUMENTS

| | | | |
|---|---|---|---|
| 5,289,334 | 2/1994 | Ker et al. | 361/56 |
| 5,359,211 | 10/1994 | Croft | 361/91 |
| 5,400,202 | 3/1995 | Metz et al. | 361/56 |
| 5,528,188 | 6/1996 | Au et al. | 361/56 |

Primary Examiner—Jeffrey A. Gaffin
Assistant Examiner—Sally C. Medley
Attorney, Agent, or Firm—Robert D. Atkins

[57] ABSTRACT

An electro-static discharge (ESD) protection circuitry 100 with a gate-capacitor-coupled (GCC) device 120 or 125 and a silicon controlled rectifier (SCR) 130 or 135 coupled to an output 101 of an output device 116 or 117 in a sub micron metal oxide semiconductor circuit is disclosed. The GCC device 120 or 125 has a lower ESD breakdown voltage than the output device 116 or 117, hence, the GCC device 120 or 125 breaks down and causes the SCR 130 or 135 to breakdown when a destructive ESD voltage impinges on the out put 101 of the output device 116 or 117. The SCR 130 or 135 upon breaking down, discharges the destructive ESD to the power supply bus VDD or VSS.

7 Claims, 1 Drawing Sheet

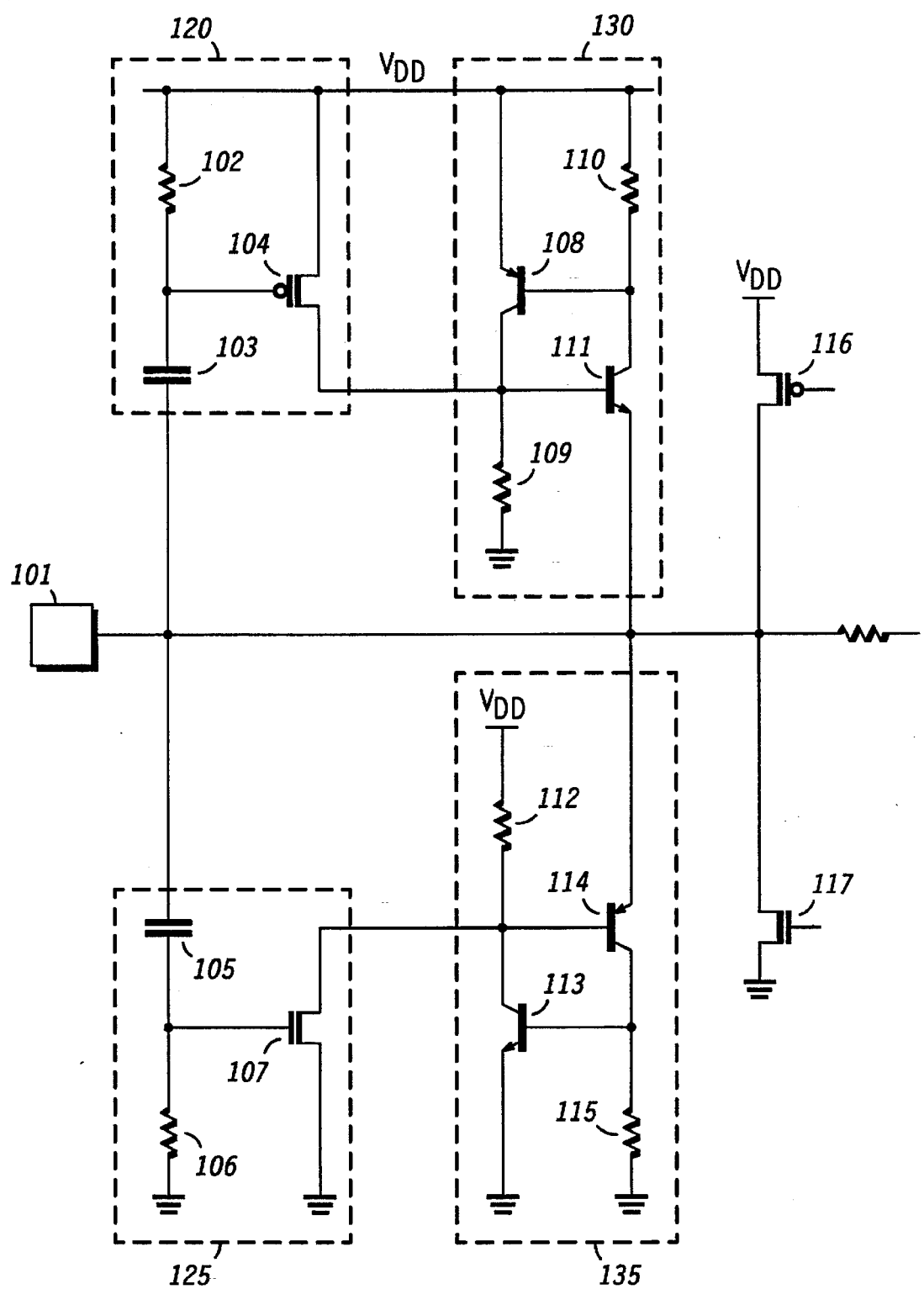

APPARATUS FOR ELECTRO-STATIC DISCHARGE PROTECTION IN A SEMICONDUCTOR DEVICE

FIELD OF THE INVENTION

The invention relates in general to electro-static discharge (ESD) protection in a semiconductor device and in particular to ESD protection in a metal oxide semiconductor (MOS) device.

BACKGROUND OF THE INVENTION

A semiconductor device having inputs and outputs for coupling to external circuitry are susceptible to damage by electro-static discharge (ESD) on the inputs and outputs. Conventionally, in a semiconductor device, ESD protection circuitry is connected between each of the inputs and outputs and the power supply bus. When a destructive ESD impinges on an input or output of the semiconductor device, the ESD protection circuitry conducts the destructive ESD away from internal circuitry of the semiconductor device to the power supply bus, thereby preventing the destructive ESD on an input or output from damaging the semiconductor device.

Typical ESD protection circuitry in a semiconductor device comprises a pair of silicon controlled rectifiers (SCRs) coupled to each input or output, and to the power supply bus in the semiconductor device. When a voltage differential greater than the ESD breakdown voltage of the SCR occurs between an input or output, and the power supply bus, one of the SCRs breaks down and discharges the ESD, therethrough, to the power supply bus. For effective ESD protection, the ESD breakdown voltage of the SCRs must be lower than the ESD breakdown voltage of the input or output circuitry in the semiconductor device. This insures that the SCRs will breakdown before the input or output circuitry is damaged by an ESD impinging on the input or output. Although conventionally SCRs are used to provide effective ESD protection in semiconductor devices, due to an inherently high ESD breakdown voltage of approximately 50 V, an SCR cannot provide effective ESD protection in sub-micron circuits where the ESD breakdown voltage of an input or output device is lower than 16 V. While ESD protection of inputs of sub-micron devices can be implemented with additional circuitry, often such additional circuitry cannot be implemented for outputs of sub-micron devices. This is because of the need for outputs of sub-micron devices to be directly connected to external circuitry.

A circuit that has been developed to provide effective ESD protection in sub-micron devices and allow outputs to be directly connected to external circuitry, is commonly referred to as the disabled buffer. With a disabled buffer, the output stage coupled to an output in a sub-micron device also provides ESD protection for the output. However, to provide ESD protection for an input of a sub-micron device with a disabled buffer, a circuit similar to the output stage is coupled to the input with the gates of the output stage coupled to VDD and VSS. To enhance the effectiveness of the disabled buffer, a capacitor is coupled between each gate of the disabled buffer and the input or output of the sub-micron device. This circuit configuration utilizing a capacitor at the gate is known as Gate-Capacitor-Coupled MOS (GCC MOS). The capacitor reduces the ESD breakdown voltage of the output stage, thus ensuring that destructive ESD exceeding the ESD breakdown voltage of the output stage is safely discharged by the GCC, thereby protecting the output stage from ESD damage. A disadvantage of using the disabled buffer to provide ESD protection is the larger area or chip real estate required relative to an SCR, to fabricate an output buffer which has good ESD performance.

Hence, there is a need to provide effective ESD protection for outputs of sub micron semiconductor devices that allows outputs to be directly connected to external circuitry, which do not require relatively large areas of chip real estate, and which does not require additional manufacturing processes to implement when fabricating a sub-micron semiconductor device.

SUMMARY OF THE INVENTION

In carrying out the objects of the present invention in one form, there is provided an apparatus for providing electro-static discharge (ESD) protection comprising: a first device having a first ESD breakdown voltage coupled to a terminal; and a second device having a second ESD breakdown voltage lower than the first ESD breakdown voltage coupled to the terminal and the first device, the second device breaking down when an ESD voltage impinging on the terminal is greater than the second ESD breakdown voltage, and in response to breaking down causing the first device to breakdown and discharge the impinging ESD voltage therethrough.

BRIEF DESCRIPTION OF THE DRAWING

The FIGURE illustrates a circuit in accordance with the preferred embodiment of the present invention.

DETAILED DESCRIPTION OF THE INVENTION

In the description that follows, references to logic 1 and 0 will be understood to represent binary logic, and the convention of VDD and VSS representing logic 1 and 0, respectively, while used in the present description, should not be regarded as a limitation of the present invention when an alternate convention for logic 1 and 0 are applied.

The FIGURE of the present specification illustrates a metal oxide semiconductor (MOS) circuit 100 comprising an output pad 101 coupled to gate-capacitor-coupled (GCC) devices 120 and 125, silicon controlled rectifier (SCRs) 130 and 135, and an output stage comprising a complimentary pair of metal oxide semiconductor field effect transistors (MOSFETS) 116 and 117. A first of the complimentary pair of MOSFETS 116 is also coupled to a first voltage potential, commonly referred to as VDD or a logic 1, and a second of the complimentary pair of MOSFETS 117 is also coupled to a second voltage potential lower than the first voltage potential, commonly referred to as VSS or logic 0. The MOSFET 116 comprises a P-MOSFET or simply a P-channel device, and the MOSFET 117 comprises an N-channel device. When the desired output at the pad, or output 101 is VDD or a logic 1, then voltages are applied to the gates of MOSFET 116 and 117 to simultaneously turn ON the MOSFET 116 and turn OFF the MOSFET 117, thereby causing the voltage VDD to appear at the pad 101 representing a logic 1. Alternatively, when the desired output at the pad 101 is VSS or a logic 0, then voltages are applied to the gates of MOSFET 116 and 117 to simultaneously turn OFF the MOSFET 116 and turn ON the MOSFET 117, thereby causing the voltage VSS to appear at the pad 101. Conventionally, the voltages applied to the gates of the MOSFETS 116 and 117 are either VDD or VSS. Typically, the MOSFETS 116 and 117 each have an electro-static-discharge (ESD) breakdown voltage of approximately 16 volts (V). This means that when the difference in potential between an ESD voltage impinging on the output 101 and VDD is greater than 16 V, the MOSFET 116 will breakdown and may be damaged. ESD damage in semiconductor devices is known in the art and no further elaboration will be provided here. Similarly, when the difference in potential between an ESD voltage impinging on the output 101 and VSS is greater than 16 V, the MOSFET 117 will be damaged. The polarity of the ESD impinging on the output 101 relative to VDD and VSS determines which of the MOSFETS 116 or 117 is damaged by the ESD. The SCRs 130 and 135 each comprise an SCR using conventional layout and architecture as is known in the art having an electro-static-discharge (ESD) breakdown voltage of approximately 50 V. The SCR 130 comprises a PNP bipolar transistor 108, a NPN bipolar transistor 111 and two resistors 110 and 109. Similarly, the SCR 135 comprises a NPN transistor 113, a PNP transistor 114, and two resistors 112 and 115. The MOSFET 104 is coupled to the base of transistor 111 and the collector of transistor 108, while the MOSFET 107 is coupled to the base of transistor 114 and the collector of transistor 113. The operation of the SCRs 130 and 135 are similar and while only the operation of the SCR 135 will be detailed below, it should be understood that the operation of the SCR 130 is the same as the operation of the SCR 135 with the necessary reverse in polarity. When the MOSFET 107 breaks down, as is explained below, a breakdown current flows from the output 101 via the emitter and base of transistor 114 to the MOSFET 107. This current causes the transistor 114 to turn ON, which causes a current to flow through the collector of transistor 114 producing a voltage across resistor 115. The voltage across resistor 115 biases the base of transistor 113 to turn ON. When the transistor 113 turns ON, a collector current of transistor 113 flows through resistor 112 which biases the transistor 114 to further conduct. Hence, in response to the breakdown current or signal, sometimes referred to as a trigger, from the MOSFET 107, the transistors 113 and 114 that constitute the SCR 135 mutually bias each other until a good conductance path from the output 101 to VSS is provided via the transistors 114 and 115. The SCRs 130 or 135 are said to turn ON or breakdown when they provide a good conductance path therethrough. The good conductance path formed by SCR 135 discharges the destructive ESD impinging on the output 101 to VSS. Similarly, a good conductance path may be formed by the SCR 130 between the output 101 and VDD to discharge the destructive ESD impinging on the output 101 to VDD. Hence, in accordance with the preferred embodiment of the present invention, the SCRs 130 or 135 breaks down and discharges a destructive ESD voltage impinging on the output 101 to either VDD or VSS, dependent on the polarity of the destructive ESD impinging on the output 101, when the SCRs 130 or 135 receive a trigger signal.

The gate-capacitor-coupled (GCC) devices 120 and 125 are coupled to VDD and VSS respectively. In addition, the GCC device 120 is coupled to the SCR 130, and the GCC device 125 is coupled to the SCR 135. The GCC 120 comprises a P-channel MOSFET 104 having its gate coupled to VDD via a resistor 102 and coupled via a capacitor 103 to the output 101. The GCC 125 comprises an N-channel MOSFET 107 having its gate coupled via a resistor 106 to VSS, and coupled via a capacitor 105 to the output 101 . Although the ESD breakdown voltage of the MOSFET 104 is substantially similar to the ESD breakdown voltage of the output MOSFET 116, the combination of the resistor 102 and the capacitor 103 lower the ESD breakdown voltage of the MOSFET 104, as described below. Hence, the MOSFET 104 breaks down at a lower ESD voltage than the MOSFET 116, and provides a trigger signal to the SCR 130 causing the SCR 130 to breakdown and discharge the ESD impinging on the output 101 to VDD. Hence, a GCC device breaks down at a lower ESD voltage than an output device, and advantageously causes an SCR to breakdown at the lower ESD voltage, thereby protecting the output device from damage by a destructive ESD.

When a destructive ESD voltage which is positive relative to VSS impinges upon the output 101, a voltage which is positive relative to VSS develops at the gate of the MOSFET 107 through the capacitor 105. The voltage developed at the gate of the MOSFET 107 biases the MOSFET 107 to breakdown. When the MOSFET 107 breaks down, a breakdown current flows from the output 101 via the emitter of the transistor 114 and MOSFET 107 to VSS. This breakdown current triggers the SCR 135 to turn breakdown, thus forming a good conductance path through the transistors 114 and 115 which discharges the destructive ESD impinging on the output 101 to VSS. When a destructive ESD voltage which is negative relative to VDD impinges upon the output 101, a voltage which is negative relative to VDD develops at the gate of MOSFET 104 through the capacitor 103. The voltage developed at the gate of the MOSFET 104 biases the MOSFET 104 to breakdown. When the MOSFET 104 breaks down, a breakdown current flows from VDD via the MOSFET 104 and resistor 109 to VSS. The breakdown current triggers the SCR 135 to breakdown, thus forming a good conductance path through the transistors 110 and 111 of the SCR 135 which discharges the ESD impinging on the output 101 to VDD.

In accordance with the present invention, a GCC device may be utilised to trigger a SCR device to provide effective ESD protection for inputs and outputs in a sub micron semiconductor device. This is achieved by combining the lower ESD breakdown characteristic of the GCC device with the ability of the SCR to provide a good conductance path for ESD. Thus, with a GCC breaking down at a lower ESD voltage than an output stage in a sub micron semiconductor device, and the GCC triggering an SCR with the breakdown current, the present invention advantageously provides effective ESD protection for the output stage in the sub micron semiconductor device. In addition, as the present invention utilises conventional GCC and SCR devices, thus no additional processes are required when fabricating a sub micron semiconductor device which employs the present invention to provide effective ESD protection.

Hence, the present invention provides effective ESD protection for outputs of sub micron semiconductor devices that allows the outputs to be directly connected to external circuitry. In addition the present invention does not require relatively large areas of chip real estate, and does not require additional manufacturing processes to implement in a sub-micron semiconductor device.

What is claimed is:

1. A sub-micron metal oxide semiconductor (MOS) circuit comprising:
   an input/output (I/O) device having a first electro-static discharge (ESD) breakdown voltage coupled to a terminal and a power supply;
   a discharge circuit having a second ESD breakdown voltage greater than the first ESD breakdown voltage coupled to the terminal and the power supply for discharging an ESD voltage impinging on the terminal to the power supply; and
   a trigger circuit having a third ESD breakdown voltage less than the first ESD breakdown voltage coupled to the terminal, the power supply and the discharge circuit for breaking down when the ESD voltage impinging on the terminal exceeds the third ESD breakdown voltage, and in response to breaking down providing a trigger signal to the discharge circuit causing the discharge circuit to breakdown and discharge the ESD voltage impinging on the terminal therethrough to the power supply, wherein the trigger circuit comprises a breakdown device having a breakdown voltage which is substantially similar to the first electro-static discharge breakdown voltage of the I/O device.

2. The sub-micron circuit of claim 1 wherein the input/output (I/O) device comprises an output stage.

3. The sub-micron circuit of claim 1 wherein the input/output (I/O) device comprises an input stage.

4. The sub-micron circuit of claim 1 wherein the trigger circuit comprises a gate-capacitor-coupled (GCC) device.

5. The sub-micron circuit of claim 4 wherein the GCC device comprises a metal oxide semiconductor field effect transistor (MOSFET) coupled via a resistor to the power supply, and coupled via a capacitor to the terminal, and coupled to the discharge circuit.

6. The sub-micron circuit of claim 1 wherein the discharge circuit comprises a silicon controlled rectifier (SCR).

7. An apparatus for electro-static discharge (ESD) protection in a sub micron device, wherein the sub micron device comprises at least one output circuit coupled to a terminal, and wherein the at least one output circuit comprises a complimentary pair of metal oxide semiconductors (MOSFETS) coupled to the terminal, and wherein a first of the pair of MOSFETS having an ESD breakdown voltage is coupled to a first voltage potential, and wherein a second of the pair of MOSFETS having the ESD breakdown voltage of the first of the pair of MOSFETS is coupled to a second voltage potential lower than the first voltage potential, the apparatus comprising:

a first discharge circuit having a first ESD breakdown voltage coupled to the terminal and the first voltage potential for discharging an ESD impinging on the terminal to the first voltage potential;

a second discharge circuit having the first ESD breakdown voltage coupled to the terminal and the second voltage potential for discharging the ESD impinging on the terminal to the second voltage potential;

a first gate capacitor coupled (GCC) device having a second ESD breakdown voltage which is lower than the ESD breakdown voltage of the first of the pair of MOSFETS coupled to the terminal, the first voltage potential and the first discharge circuit for breaking down when the difference in potential between the ESD impinging on the terminal and the first voltage potential exceeds the second ESD breakdown voltage, and in response to breaking down providing an output signal to the first discharge circuit causing the first discharge circuit to breakdown and discharge the ESD impinging on the terminal to the first voltage potential, wherein the first GCC device comprises a first triggering MOSFET having an ESD breakdown voltage which is substantially similar to the ESD breakdown voltage of the first of the pair of MOSFETS and which is adapted to have the second ESD breakdown voltage; and a second GCC device having a third ESD breakdown voltage which is lower than the ESD breakdown voltage of the second of the pair of MOSFETS coupled to the terminal, the second voltage potential and the second discharge circuit for breaking down when the difference in potential between the ESD impinging on the terminal and the second voltage potential exceeds the third ESD breakdown voltage, and in response to breaking down providing an output signal to the second discharge circuit causing the second discharge circuit to breakdown and discharge the ESD impinging on the terminal to the second voltage potential, wherein the second GCC device comprises a second triggering MOSFET having an ESD breakdown voltage which is substantially similar to the ESD breakdown voltage of the second of the pair of MOSFETS and which is adapted to have the third ESD breakdown voltage.

* * * * *